(12) United States Patent
Shin

(10) Patent No.: US 10,726,915 B2
(45) Date of Patent: Jul. 28, 2020

(54) SEMICONDUCTOR MEMORY APPARATUS, SEMICONDUCTOR SYSTEM AND ELECTRONIC DEVICE INCLUDING THE SEMICONDUCTOR MEMORY APPARATUS

(71) Applicant: SK hynix Inc., Icheon-si Gyeonggi-do (KR)

(72) Inventor: Min Chul Shin, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/454,222

(22) Filed: Jun. 27, 2019

(65) Prior Publication Data

US 2020/0058351 A1    Feb. 20, 2020

(30) Foreign Application Priority Data

Aug. 17, 2018   (KR) .................. 10-2018-0095876

(51) Int. Cl.
*G06F 3/044*   (2006.01)
*G11C 13/00*   (2006.01)

(52) U.S. Cl.
CPC ........ *G11C 13/0028* (2013.01); *G11C 13/004* (2013.01); *G11C 13/0026* (2013.01); *G11C 13/0038* (2013.01)

(58) Field of Classification Search
CPC .................................................. G11C 11/2273
USPC .................................................. 365/189.011
See application file for complete search history.

(56) References Cited

U.S. PATENT DOCUMENTS

| | | |
|---|---|---|
| 9,691,481 B2 | 6/2017 | Castro |
| 2003/0026122 A1* | 2/2003 | Nair ........................ G11C 11/22 |
| | | 365/145 |
| 2006/0062042 A1* | 3/2006 | Karlsson ................. G11C 11/22 |
| | | 365/145 |
| 2011/0134686 A1 | 6/2011 | Sohn et al. |
| 2016/0351272 A1* | 12/2016 | Sanasi ................ G11C 16/3459 |
| 2018/0144171 A1* | 5/2018 | Liang ...................... H03M 1/66 |
| 2018/0331114 A1* | 11/2018 | Vimercati ............. G11C 11/221 |
| 2020/0013446 A1* | 1/2020 | Cho .................... G11C 13/0023 |

\* cited by examiner

*Primary Examiner* — Min Huang
(74) *Attorney, Agent, or Firm* — William Park & Associates Ltd.

(57) ABSTRACT

A semiconductor memory apparatus includes a memory cell coupled between a bit line and a word line. A sensing line is disposed adjacent to the word line to form a capacitor together with the word line. A sense amplifier coupled to the sensing line generates an output signal by detecting a voltage level of the sensing line.

21 Claims, 6 Drawing Sheets

SEMICONDUCTOR MEMORY APPARATUS, SEMICONDUCTOR SYSTEM AND ELECTRONIC DEVICE INCLUDING THE SEMICONDUCTOR MEMORY APPARATUS

CROSS-REFERENCES TO RELATED APPLICATION

The present application claims priority under 35 U.S.C. § 119(a) to Korean application number 10-2018-0095876, filed on Aug. 17, 2018, in the Korean Intellectual Property Office, which is incorporated herein by reference in its entirety.

BACKGROUND

1. Technical Field

Various embodiments of the present disclosure relate to an integrated circuit technology and, more particularly, to a semiconductor memory apparatus and semiconductor system.

2. Related Art

An electronic device, such as computer, may have many semiconductor components and include a memory apparatus. Dynamic random access memory (DRAM) is widely used as a general memory apparatus, having the advantage that it stores and outputs data at a fast and steady speed and is of random access. However, DRAM has a volatile characteristic in that it loses stored data when powered off because it has a memory cell comprising a capacitor. Flash memory overcomes the volatile disadvantage of DRAM. Flash memory has a non-volatile characteristic in that it retains stored data even when powered off because it has a memory cell comprising a floating gate. However, flash memory has a disadvantage in that it stores and outputs data at a slow speed and is not of random access, when compared with DRAM.

Next-generation memory apparatuses, such as phase change RAM (PCM), magnetic RAM, resistive RAM, and ferroelectric RAM, have the advantage of fast operational speed and non-volatile characteristics. Particularly, PCM has a phase change memory cell comprising a chalcogenide and is capable of storing data by changing a resistive value of the memory cell.

SUMMARY

In an embodiment of the present disclosure, a semiconductor memory apparatus may include a memory cell, a sensing line, and a sense amplifier. The memory cell may be coupled between a bit line and a word line. The sensing line may be disposed adjacent to the word line to form a capacitor together with the word line. The sense amplifier may be coupled to the sensing line and configured to generate an output signal by detecting a voltage level of the sensing line.

In an embodiment of the present disclosure, a semiconductor memory apparatus may include a plurality of memory cells, a plurality of sensing lines, and a sense amplifier. The plurality of memory cells may be coupled between a plurality of bit lines and a plurality of word lines, respectively. The plurality of sensing lines may be disposed adjacent to the plurality of word lines to form capacitors together with the plurality of word lines, respectively. Further, the plurality of sensing lines may extend in a direction substantially parallel with the plurality of bit lines and substantially perpendicular to the plurality of word lines. The sense amplifier may be coupled to the plurality of sensing lines and configured to generate an output signal by detecting voltage levels of the plurality of sensing lines.

In an embodiment of the present disclosure, an operating method of a semiconductor memory apparatus may include selecting a memory cell by selecting a bit line based on a bit line selection signal and selecting a word line based on a word line selection signal. The operating method may also include precharging the word line to a second power voltage. The operating method may further include changing a voltage level of the word line selection signal and allowing a sneak current to flow through the word line. The method may additionally include providing a first power voltage to the bit line and detecting a voltage level of a sensing line disposed adjacent to the word line to form a capacitor together with the word line.

DETAILED DESCRIPTION

Hereinafter, semiconductor apparatuses according to the present disclosure are described below with reference to the accompanying drawings through various embodiments.

Figure 1:
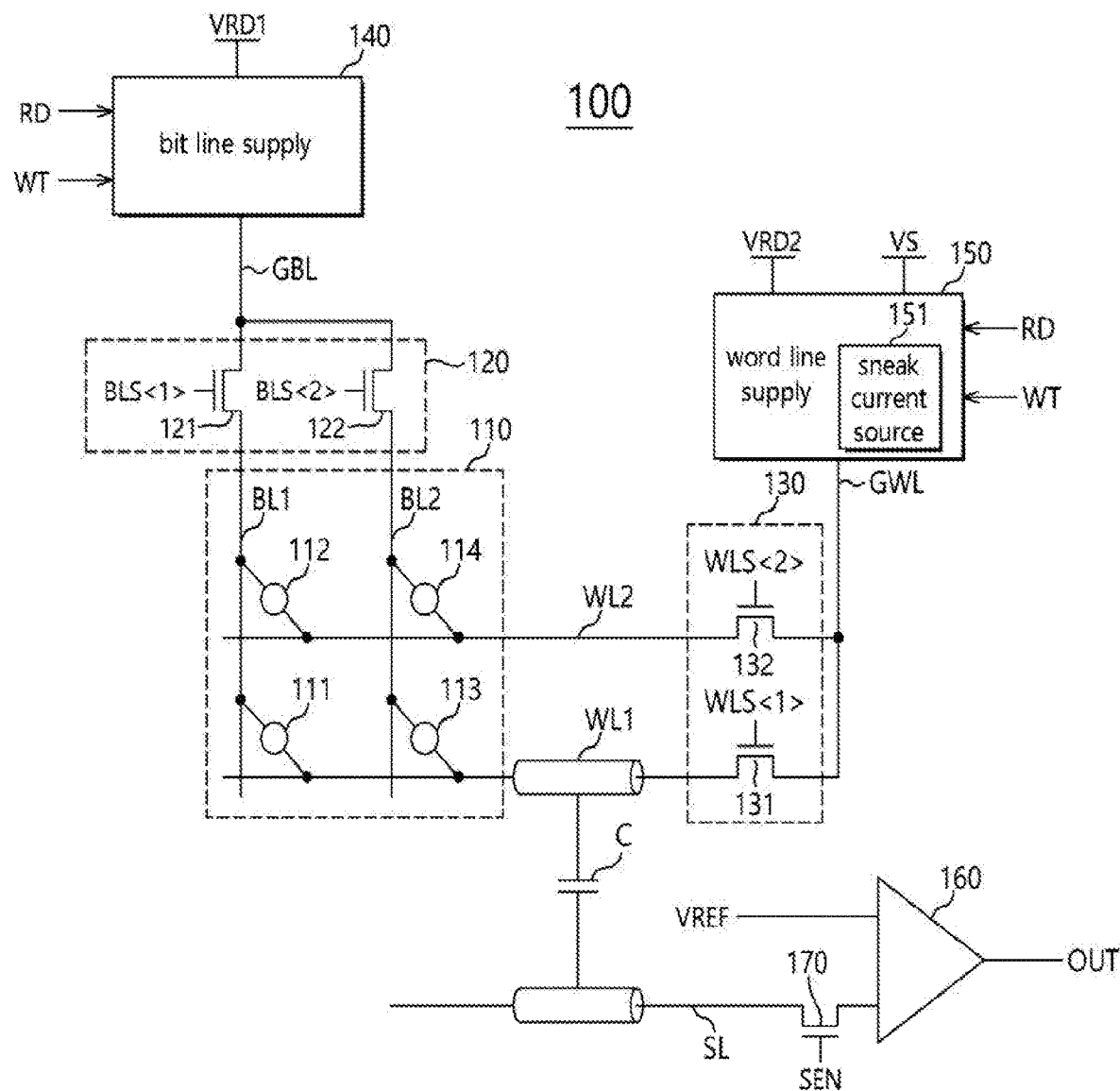
FIG. 1 shows a schematic diagram illustrating a configuration of a semiconductor memory apparatus, in accordance with an embodiment of the present disclosure.

FIG. 1 shows a schematic diagram illustrating a configuration of a semiconductor memory apparatus 100, in accordance with an embodiment of the present disclosure. Referring to FIG. 1, the semiconductor memory apparatus 100 may include a memory cell array 110. The memory cell array 110 may include a plurality of bit lines, a plurality of word lines, and a plurality of memory cells respectively coupled to cross points of the plurality of bit lines and the plurality of word lines. The plurality of memory cells may be phase change memory cells each including a phase change material, such as a chalcogenide. Each of the plurality of memory cells may be snapped-back and thus turned on when a voltage higher than a threshold voltage is applied to both ends of the memory cell or a current greater than a threshold current flows through the memory cell. The plurality of memory cells may be programmed to a high-resistance state and a low-resistance state. The plurality of memory cells may be programmed to a high-resistance state to store reset data. The plurality of memory cells may be programmed to a low-resistance state to store set data. In an embodiment, the plurality of memory cells may be programmed to more than 3 resistance states to store multi-bit data.

FIG. 1 illustrates 4 memory cells respectively coupled to cross points between a first bit line BL1 and a second bit line BL2 and a first word line WL1 and a second word line WL2. A first memory cell 111 may be coupled to a cross point between the first bit line BL1 and the first word line WL1, a second memory cell 112 may be coupled to a cross point between the first bit line BL1 and the second word line WL2, a third memory cell 113 may be coupled to a cross point between the second bit line BL2 and the first word line WL1, and a fourth memory cell 114 may be coupled to a cross point between the second bit line BL2 and the second word line WL2.

The semiconductor memory apparatus 100 may further include a column selection circuit 120 and a row selection circuit 130. The column selection circuit 120 may couple one or more bit lines, among the plurality of bit lines, to a global bit line GBL. The column selection circuit 120 may receive a plurality of bit line selection signals and may couple one or more bit lines, among the plurality of bit lines, to the global bit line GBL based on the plurality of bit line selection signals. The column selection circuit 120 may include a plurality of column switches. The plurality of column switches may respectively receive the plurality of bit line selection signals and may respectively select one or more bit lines to be coupled to the global bit line GBL. Although FIG. 1 illustrates a first column switch 121 configured to couple the first bit line BL1 to the global bit line GBL and a second column switch 122 configured to couple the second bit line BL2 to the global bit line GBL, the semiconductor memory apparatus 100 may include a number of column switches which corresponds to a number of bit lines included in the memory cell array 110.

The first column switch 121 may couple the first bit line BL1 to the global bit line GBL based on the bit line selection signal BLS<1>. The second column switch 122 may couple the second bit line BL2 to the global bit line GBL based on the bit line selection signal BLS<2>. The bit line selection signals BLS<1> and BLS<2> may be generated according to a column address signal. In an embodiment, the semiconductor memory apparatus 100 may have a hierarchical bit line structure. Although not illustrated, the column selection circuit 120 may include hierarchical switches, such as local column switches and a global column switch. According to the hierarchical bit line structure, the local column switch may couple a local bit line to one among the plurality of bit lines, and the global column switch may couple the global bit line GBL to one among the plurality of local bit lines.

The row selection circuit 130 may couple one or more word lines, among the plurality of word lines, to a global word line GWL. The row selection circuit 130 may receive a plurality of word line selection signals and may couple one or more word lines, among the plurality of word lines, to a global word line GWL based on the plurality of word line selection signals. The row selection circuit 130 may include a plurality of row switches. The plurality of row switches may respectively receive the plurality of word line selection signals and may respectively select one or more word lines to be coupled to the global word line GWL. Although FIG. 1 illustrates a first row switch 131 configured to couple the first word line WL1 to the global word line GWL and a second row switch 132 configured to couple the second word line WL2 to the global word line GWL, the semiconductor memory apparatus 100 may include a number of row switches which corresponds to a number of word lines included in the memory cell array 110.

The first row switch 131 may couple the first word line WL1 to the global word line GWL based on the word line selection signal WLS<1>. The second row switch 132 may couple the second word line WL2 to the global word line GWL based on the word line selection signal WLS<2>. The word line selection signals WLS<1> and WLS<2> may be generated according to a row address signal. In an embodiment, the semiconductor memory apparatus 100 may have a hierarchical word line structure. Although not illustrated, the row selection circuit 130 may include hierarchical switches, such as local row switches and a global row switch. According to the hierarchical word line structure, the local row switch may couple a local word line to one among the plurality of word lines, and the global row switch may couple the global word line GWL to one among the plurality of local word lines.

The semiconductor memory apparatus 100 may further include a bit line supply 140 and a word line supply 150. The bit line supply 140 may supply a power voltage to the global bit line GBL. The bit line supply 140 may receive a read signal RD and a write signal WT. The read signal RD may be generated for the semiconductor memory apparatus 100 to read data stored in the memory cells during a read operation of the semiconductor memory apparatus 100. The write signal WT may be generated for the semiconductor memory apparatus 100 to program data into the memory cells during a write operation of the semiconductor memory apparatus 100. The bit line supply 140 may provide, based on the read signal RD, the global bit line GBL with a power voltage for the read operation and may provide, based on the write signal WT, the global bit line GBL with a power voltage for the write operation. The bit line supply 140 may provide the global bit line GBL and a selected bit line with a first power voltage VRD1 based on the read signal RD. The bit line supply 140 may raise the voltage levels of the global bit line GBL and the selected bit line to the level of the first power voltage VRD1 by providing the global bit line GBL with the first power voltage VRD1.

The word line supply 150 may supply a power voltage to the global word line GWL. The word line supply 150 may receive the read signal RD and the write signal WT. The word line supply 150 may provide, based on the read signal RD, the global word line GWL with a power voltage for the read operation and may provide, based on the write signal WT, the global word line GWL with a power voltage for the write operation. The word line supply 150 may provide the global word line GWL with a second power voltage VRD2 based on the read signal RD. The second power voltage VRD2 may have lower level than the first power voltage VRD1. The word line supply 150 may lower the voltage levels of the global word line GWL and the selected word line to the level of the second power voltage VRD2 by providing the global word line GWL and the selected word line with the second power voltage VRD2. The word line supply 150 may provide the global word line GWL with a third power voltage VS while the semiconductor memory apparatus 100 is not performing a read operation or a write operation. The third power voltage VS may have a higher level than the second power voltage VRD2 and lower level than the first power voltage VRD1. For example, the third power voltage VS may have a voltage level corresponding to a ground voltage.

The word line supply 150 may precharge the global word line GWL and a selected word line to the level of the second power voltage VRD2 by providing the global word line GWL with the second power voltage VRD2 based on the read signal RD. After the selected word line is precharged to the level of the second power voltage VRD2, the semiconductor memory apparatus 100 may change voltage levels of the word line selection signals. The semiconductor memory apparatus 100 may change the voltage levels of the word line selection signals such that the conductivity between the global word line GWL and the selected word line becomes reduced. After the selected word line is precharged to the level of the second power voltage VRD2, the word line supply 150 may allow a sneak current to flow through the global word line GWL. The word line supply 150 may include a sneak current source 151 configured to generate the sneak current. The sneak current may be a small amount of current such that the global word line GWL and the selected word line are electrically conducting. In an embodiment, the semiconductor memory apparatus 100 may disable the word line selection signals and may disconnect the electrical coupling between the global word line GWL and the selected word line, after the selected word line is precharged to the level of the second power voltage VRD2. Therefore, the selected word line may be floated and the semiconductor memory apparatus 100 may perform a read operation according to a floating scheme.

Referring to FIG. 1, the semiconductor memory apparatus 100 may further include a sensing line SL and a sense amplifier 160. The sensing line SL may be disposed adjacent to the first and second word lines WL1 and WL2. The sensing line SL may be disposed adjacent to the first and second word lines WL1 and WL2 so that the sensing line SL forms a capacitor C together with the first and second word lines WL1 and WL2. As the sensing line SL is adjacent to the first and second word lines WL1 and WL2, there may form a mutual capacitance between the sensing line SL and the first and second word lines WL1 and WL2. This mutual capacitance is represented by the capacitor C shown in FIG. 1. For various embodiments of the present teachings, use is made of the mutual capacitance that occurs between one or more sensing lines and one or more bit lines. When the voltage levels of the first and second word lines WL1 and WL2 change, the voltage level of the sensing line SL may change through the capacitor C. The sensing line SL may be extended in a direction substantially parallel with the extended direction of the first and second bit lines BL1 and BL2 and substantially perpendicular to the extended direction of the first and second word lines WL1 and WL2.

The sense amplifier 160 may generate an output signal OUT by sensing the voltage level of the sensing line SL. The sense amplifier 160 may receive a read reference voltage VREF. The read reference voltage VREF may have a voltage level with which the voltage level change of the sensing line SL can be sensed. The sense amplifier 160 may generate the output signal OUT by comparing the voltage level of the sensing line SL and the read reference voltage VREF. For example, the sense amplifier 160 may generate the output signal OUT having a logic high level when the voltage level of the sensing line SL is higher than the read reference voltage VREF. The sense amplifier 160 may generate the output signal OUT having a logic low level when the voltage level of the sensing line SL is lower than the read reference voltage VREF. The sense amplifier 160 may be coupled, when a sensing enable signal SEN is enabled, to the sensing line SL to sense the voltage level of the sensing line SL. The sensing enable signal SEN may be enabled a predetermined time after the first power voltage VRD1 is provided to a selected bit line through the global bit line GBL. For example, the sensing enable signal SEN may be enabled a predetermined time after the read signal RD is enabled. The predetermined time may have enough duration so that a voltage level of a selected bit line rises to the first power voltage VRD1 to cause the snap-back of the memory cells.

The semiconductor memory apparatus 100 may further include a sensing switch 170. The sensing switch 170 may receive the sensing enable signal SEN. The sensing switch 170 may couple, when the sensing enable signal SEN is enabled, the sensing line SL to the sense amplifier 160.

In general, a sense amplifier of a semiconductor memory apparatus is coupled to a global word line GWL and generates an output signal OUT by sensing the voltage level of the global word line GWL. Therefore, the voltage levels of the global word line GWL and a selected word line should be kept to the level of the second power voltage VRD2 during a read operation of the semiconductor memory apparatus because the sense amplifier should sense the voltage level of the global word line GWL or a current flowing through the global word line GWL. The first memory cell 111 is selected when the first bit line BL1 and the first word line WL1 are selected, and the first memory cell 111 becomes a target memory cell. When the first memory cell 111 is selected, one end of the second memory cell 112 is coupled to the unselected second word line WL2 while the other end of the second memory cell 112 is coupled to the selected first bit line BL1. Also, one end of the third memory cell 113 is coupled to the unselected second bit line BL2 while the other end of the third memory cell 113 is coupled to the selected first word line WL1. Memory cells have various threshold voltage according to change of process, voltage, or temperature, and unselected memory cell coupled to a selected bit line and a selected word line may be turned on. Therefore, there may occur a disturbance of losing data stored in a memory cell adjacent to the target memory cell as the adjacent memory cell is turned on.

In accordance with an embodiment of the present disclosure, the sense amplifier 160 of the semiconductor memory apparatus 100 may generate the output signal OUT by sensing the voltage level of the sensing line SL disposed adjacent to the word lines. Therefore, the semiconductor memory apparatus 100 may reduce the conductivity of the global word line GWL and a selected word line by changing the voltage levels of the word line selection signals after precharging the global word line GWL and the selected word line to the level of the second power voltage VRD2. When the conductivity of the global word line GWL and a selected word line is reduced, the disturbance between the target memory cell and the adjacent memory cell may be mitigated. Because it is possible to sense data stored in a memory cell through the sensing line SL disposed adjacent to the word lines even when only the sneak current flows through the global word line GWL, a spike current that occurs during a read operation may be reduced, and power consumption during the read operation may also be reduced.

Figure 2:
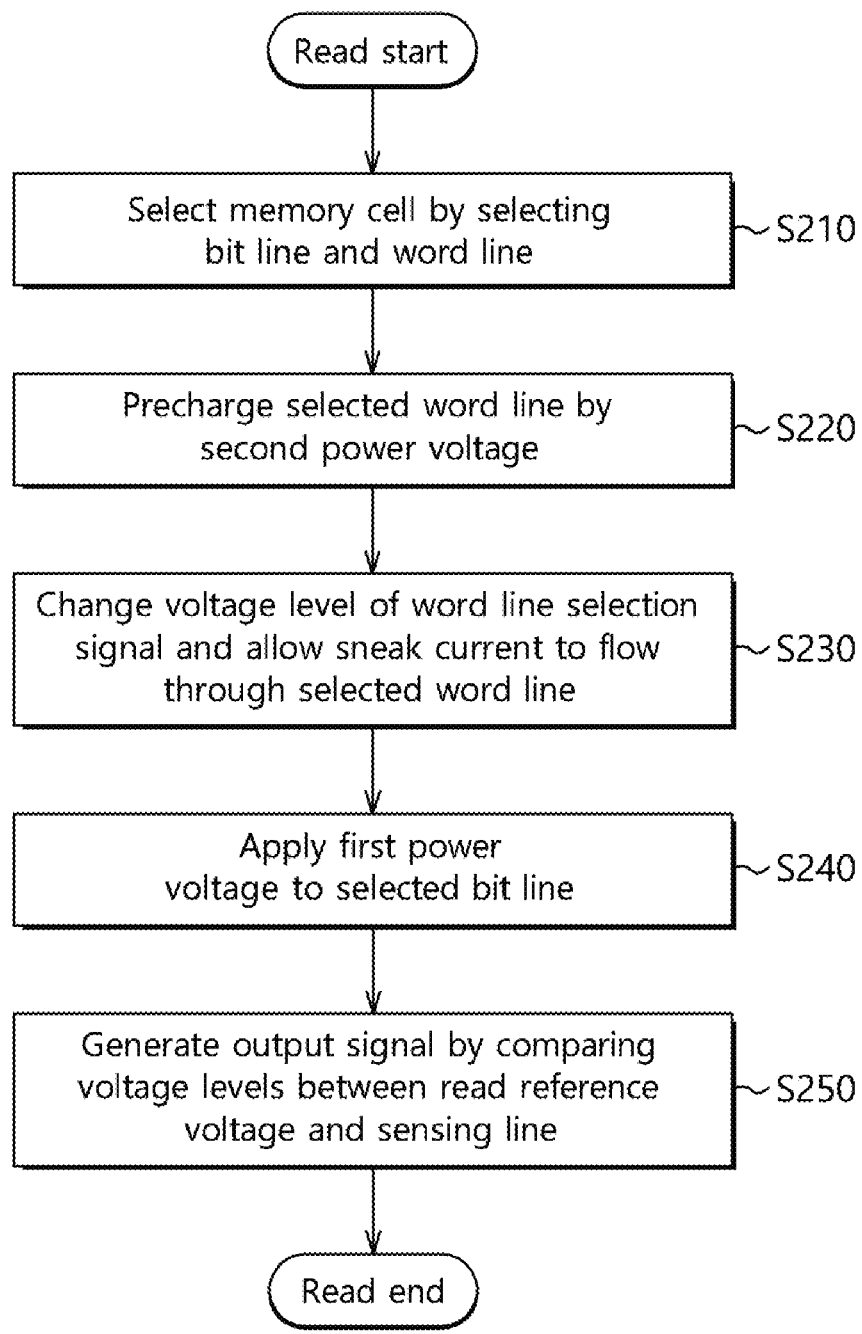
FIG. 2 shows a flowchart illustrating a method of operation of a semiconductor memory apparatus, in accordance with an embodiment of the present disclosure.

FIG. 2 shows a flowchart illustrating a method of operation of the semiconductor memory apparatus 100, in accordance with an embodiment of the present disclosure. The method of operation of the semiconductor memory apparatus 100 is described with reference to FIGS. 1 and 2. During a read operation of the semiconductor memory apparatus 100, a particular bit line and a particular word line may be selected when the bit line selection signals and the word line selection signals are enabled on the basis of a column address signal and a row address signal. When the particular bit line and the particular word line are selected, a particular memory cell may be accessed (S210). For example, as illustrated in FIG. 1, the first column switch 121 may couple the first bit line BL1 to the global bit line GBL based on the bit line selection signal BLS<1>, and the first row switch 131 may couple the first word line WL1 to the global word line GWL based on the word line selection signal WLS<1>. As the first bit line BL1 and the first word line WL1 are selected, the first memory cell 111 may be selected.

The word line supply 150 may provide the second power voltage VRD2 to the global word line GWL based on the read signal RD, and the second power voltage VRD2 may be provided to a selected word line through the global word line GWL (S220). The first word line WL1 may be provided with the second power voltage VRD2 through the global word line GWL, thus the global word line GWL and the first word line WL1 may be precharged to the level of the second power voltage VRD2.

When the global word line GWL and the selected word line are precharged, the semiconductor memory apparatus 100 may change the voltage level of the word line selection signal WLS<1> (S230). The semiconductor memory apparatus 100 may change the voltage level of the word line selection signal WLS<1> such that the conductivity between the global word line GWL and the first word line WL1 is reduced. For example, the semiconductor memory apparatus 100 may change the voltage level of the word line selection signal WLS<1> from a voltage level to fully turn on the first row switch 131 to a voltage level to partially turn on the first row switch 131. When the first row switch 131 is implemented with an N-channel MOS transistor, the semiconductor memory apparatus 100 may lower the voltage level of the word line selection signal WLS<1>. When the global word line GWL and the first word line WL1 are precharged, the word line supply 150 may allow a sneak current to flow through the global word line GWL and the first word line WL1 (S230). In an embodiment, the semiconductor memory apparatus 100 may disable the word line selection signal WLS<1> when the global word line GWL and the selected word line are precharged.

Then, the bit line supply 140 may provide the first power voltage VRD1 to the global bit line GBL, and the first power voltage VRD1 may be provided to a selected bit line through the global bit line GBL (S240). The first bit line BL1 may be provided with the first power voltage VRD1 through the global bit line GBL. When the voltage level of the first bit line BL1 rises to the level of the first power voltage VRD1, there may occur a snap-back according to the resistance state of the first memory cell 111. For example, the snap-back might not occur and the first memory cell 111 might not be turned on when the first memory cell 111 is in a high-resistance state. The snap-back may occur and the first memory cell 111 may be turned on when the first memory cell 111 is in a low-resistance state. When the first memory cell 111 is in the high-resistance state, the snap-back might not occur and thus a small amount of current may flow through the first memory cell 111 and the voltage level of the first word line WL1 might not change. When the first memory cell 111 is in the low-resistance state, the snap-back may occur and thus a great amount of current may flow through the first memory cell 111 and accordingly a great amount of current may flow from the first bit line BL1 to the first word line WL1 through the first memory cell 111. Therefore, the voltage level of the first word line WL1 may rise.

When the first power voltage VRD1 is provided to the first bit line BL1 and the predetermined time elapses to cause the snap-back of the memory cells, the sensing enable signal SEN may be enabled. The sense amplifier 160 may generate, when the sensing enable signal SEN is enabled, the output signal OUT by comparing the voltage level of the sensing line SL with the level of the read reference voltage VREF (S250). When the first memory cell 111 is in a high-resistance state, the voltage level of the first word line WL1 might not change and the voltage level of the sensing line SL might not change. Therefore, the sense amplifier 160 may generate the output signal OUT having a logic low level by detecting the voltage level of the sensing line SL, which is lower than the level of the read reference voltage VREF. The sense amplifier 160 may sense the data stored in the first memory cell 111 as reset data. When the first memory cell 111 is in a low-resistance state, the voltage level of the first word line WL1 may rise and the voltage level of the sensing line SL may rise through the capacitor C. Therefore, the sense amplifier 160 may generate the output signal OUT having a logic high level by detecting the voltage level of the sensing line SL, which is higher than the level of the read reference voltage VREF. The sense amplifier 160 may sense the data stored in the first memory cell 111 as set data.

Figure 3:
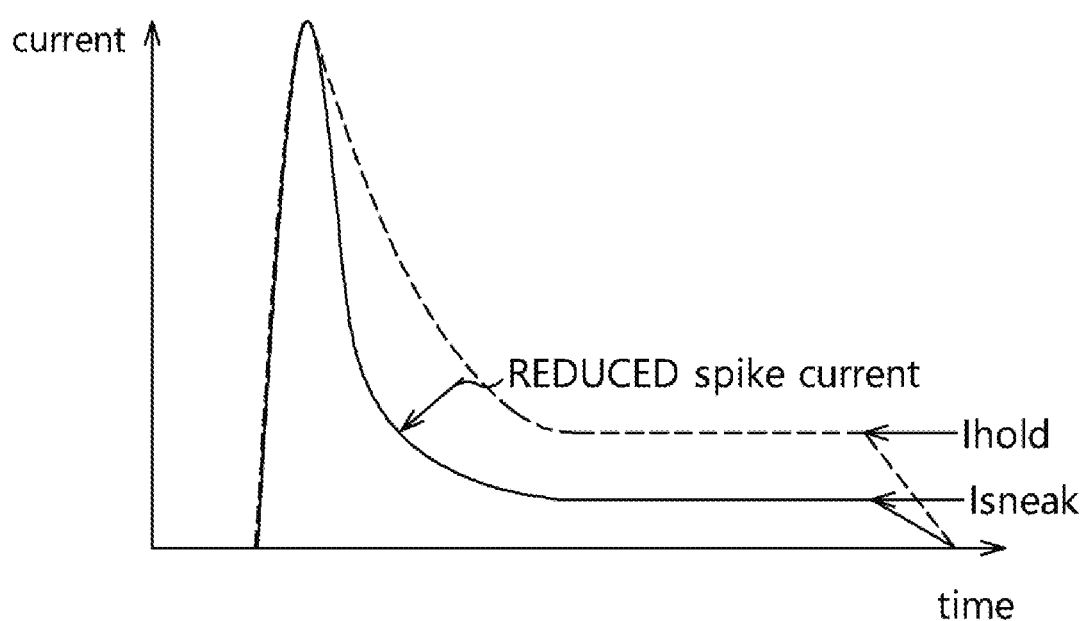
FIG. 3 shows a graph illustrating a spike current that occurs during a read operation of a semiconductor memory apparatus, in accordance with an embodiment of the present disclosure.

FIG. 3 shows a graph illustrating a representation of an example of an amount of a spike current that occurs during a read operation of the semiconductor memory apparatus 100, in accordance with an embodiment of the present disclosure. In the graph, the x-axis represents time and y-axis represents an amount of current. The solid line represents the spike current that occurs during a read operation of the semiconductor memory apparatus 100 in accordance with an embodiment of the present teachings, and the dotted line represents the spike current that occurs during a read operation of a general semiconductor memory apparatus. In a semiconductor memory apparatus having a sense amplifier and a global word line coupled to each other, the voltage level of the word line selection signal is kept and a predetermined amount of current Ihold flows through the global word line during a read operation. As illustrated in FIG. 1, the semiconductor memory apparatus 100 may reduce, when the global word line GWL and the first word line WL1 are precharged to the level of the second power voltage VRD2, the conductivity of the row selection circuit 130 and/or the conductivity between the global word line GWL and the first word line WL1 by changing the voltage level of the word line selection signal WLS provided to the row selection circuit 130. Also, the semiconductor memory apparatus 100 may allow only the sneak current Isneak to flow through the global word line GWL and the first word line WL1. Therefore, an amount of current flowing from the first word line WL1 to the global word line GWL may be drastically reduced. When a memory cell is provided with a voltage higher than the threshold voltage, there may occur the snap-back of the memory cell and there may occur a spike current. The semiconductor memory apparatus 100 may reduce an amount of the spike current, which occurs when a memory cell is turned on, by changing the voltage level of the word line selection signal WLS and allowing the sneak current to flow through the word line WL. As the voltage level of the word line selection signal WLS is lowered more, the amount of the spike current may be reduced more. Therefore, power consumption may be reduced during a read operation of the semiconductor memory apparatus 100.

Figure 4:
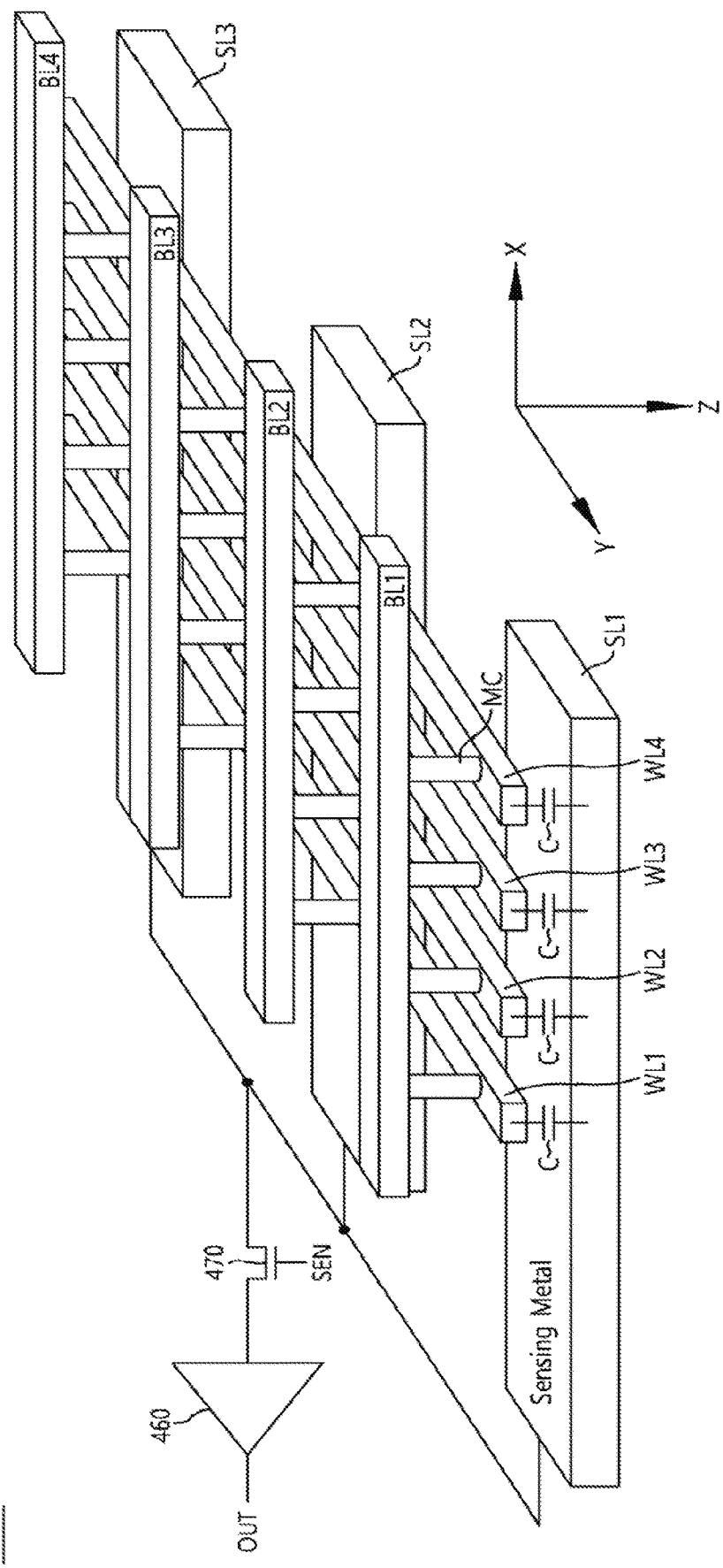
FIG. 4 shows a perspective view illustrating a configuration of a semiconductor memory apparatus, in accordance with an embodiment of the present disclosure.

FIG. 4 shows a perspective view illustrating a configuration of a semiconductor memory apparatus 400, in accordance with an embodiment of the present disclosure. Referring to FIG. 4, the semiconductor memory apparatus 400 may include a plurality of bit lines, a plurality of word lines, and a plurality of sensing lines. FIG. 4 illustrates four bit lines, four word lines, and three sensing lines, to which embodiments of the present disclosure are not limited. A first bit line BL1, a second bit line BL2, a third bit line BL3, and a fourth bit line BL4 may extend in a first direction (e.g., X direction) and may be sequentially disposed in a second direction (e.g., Y direction). A first word line WL1, a second word line WL2, a third word line WL3, and a fourth word line WL4 may be disposed under the first to fourth bit lines BL1, BL2, BL3, and BL4 in a third direction (e.g., Z direction). The first to fourth word lines WL1, WL2, WL3, and WL4 may extend in the second direction (i.e., Y direction) and may be sequentially disposed in the first direction (i.e., X direction). A plurality of memory cells MC may be coupled between the first to fourth bit lines BL1, BL2, BL3, and BL4 and the first to fourth word lines WL1, WL2, WL3, and WL4 at cross points between the first to fourth bit lines BL1, BL2, BL3, and BL4 and the first to fourth word lines WL1, WL2, WL3, and WL4, respectively.

A first sensing line SL1, a second sensing line SL2, and a third sensing line SL3 may be disposed under the first to fourth word lines WL1, WL2, WL3, and WL4 in the third direction (i.e., Z direction). The first to third sensing lines SL1, SL2, and SL3 may be disposed adjacent to the first to fourth word lines WL1, WL2, WL3, and WL4 such that the first to third sensing lines SL1, SL2, and SL3 form capacitors C together with the first to fourth word lines WL1, WL2, WL3, and WL4, respectively. The first to third sensing lines SL1, SL2, and SL3 may be extended in a direction substantially parallel with the extended direction of the first to fourth bit lines BL1, BL2, BL3, and BL4 and substantially perpendicular to the extended direction of the first to fourth word lines WL1, WL2, WL3, and WL4. The first to third sensing lines SL1, SL2, and SL3 may extend in the first direction (i.e., X direction) and may be sequentially disposed in the second direction (i.e., Y direction), which is similar to the first to fourth bit lines BL1, BL2, BL3, and BL4. The number of first to third sensing lines SL1, SL2, and SL3 may be less than the number of first to fourth bit lines BL1, BL2, BL3, and BL4 included in the semiconductor memory apparatus 400. In accordance with other embodiments, the number of sensing lines may be less than the number of bit lines, wherein the number of sensing lines and the number of bit lines are not limited to three and four, respectively. The first to third sensing lines SL1, SL2, and SL3 may be implemented as sensing metal which has different characteristics from metals of the first to fourth bit lines BL1, BL2, BL3, and BL4 and the first to fourth word lines WL1, WL2, WL3, and WL4.

The first to third sensing lines SL1, SL2, and SL3 may form the capacitors C together with the first to fourth word lines WL1, WL2, WL3, and WL4. When a voltage level of one among the first to fourth word lines WL1, WL2, WL3, and WL4 changes, voltage levels of the first to third sensing lines SL1, SL2, and SL3 may also change through the capacitors C.

The semiconductor memory apparatus 400 may include a sense amplifier 460 and a sensing switch 470. The sensing switch 470 may couple the first to third sensing lines SL1, SL2, and SL3 to the sense amplifier 460 based on a sensing enable signal SEN. The sense amplifier 460 may generate an output signal OUT by detecting the voltage level change of one among the first to third sensing lines SL1, SL2, and SL3. The sense amplifier 460 may receive a read reference voltage VREF, such as for the sense amplifier 160 illustrated in FIG. 1. The sense amplifier 460 may generate the output signal OUT by comparing the read reference voltage VREF with the voltage levels of the first to third sensing lines SL1, SL2, and SL3.

Figure 5:
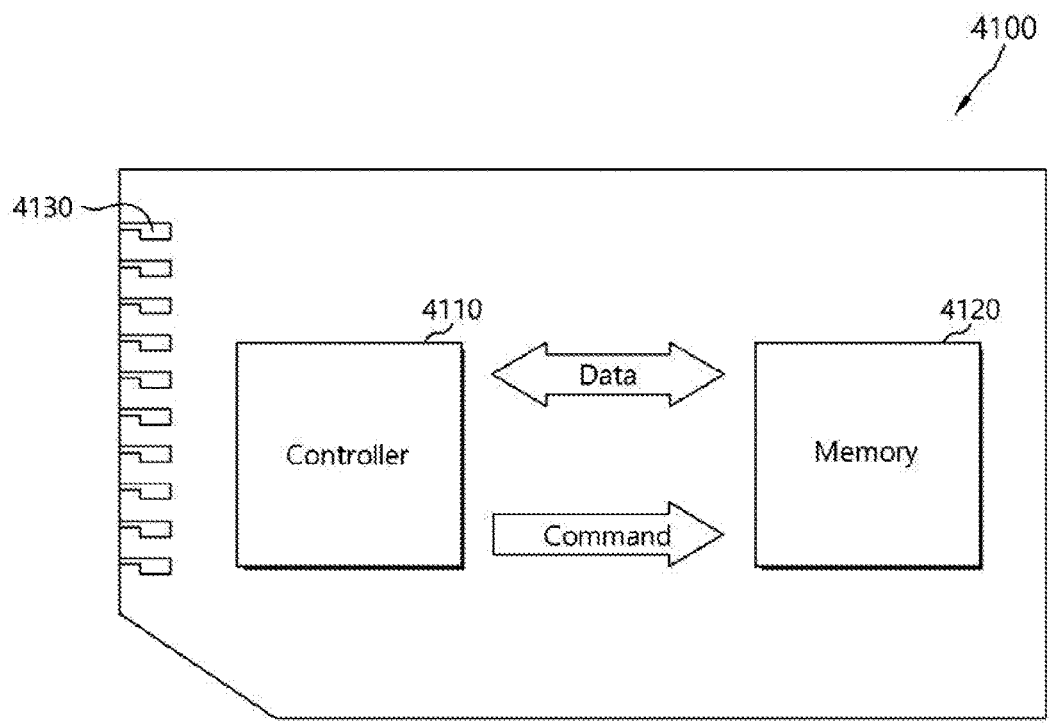
FIG. 5 shows a diagram illustrating a memory card including a semiconductor memory apparatus, in accordance with an embodiment of the present disclosure.

FIG. 5 shows a diagram illustrating a memory card system 4100 including a semiconductor memory apparatus in accordance with some embodiments. Referring to FIG. 5, the memory card system 4100 may include a controller 4110, a memory 4120, and interface members 4130. The controller 4110 and the memory 4120 may be configured to exchange a command and/or data. For example, the memory 4120 may be used in storing a command to be executed by the controller 4110 and/or user data.

The memory card system 4100 may store data in the memory 4120 or output data from the memory 4120 to a device external to the memory card system 4100. The memory 4120 may include at least one semiconductor memory apparatus in accordance with the present teachings, such as the semiconductor memory apparatus 100 of FIG. 1 and/or 400 of FIG. 4.

The interface members 4130 may control the input/output of data from/to the device external to the memory card system 4100. The memory card system 4100 may be, but is not limited to, a multimedia card (MMC), a secure digital card (SD), or a portable data storage device.

Figure 6:
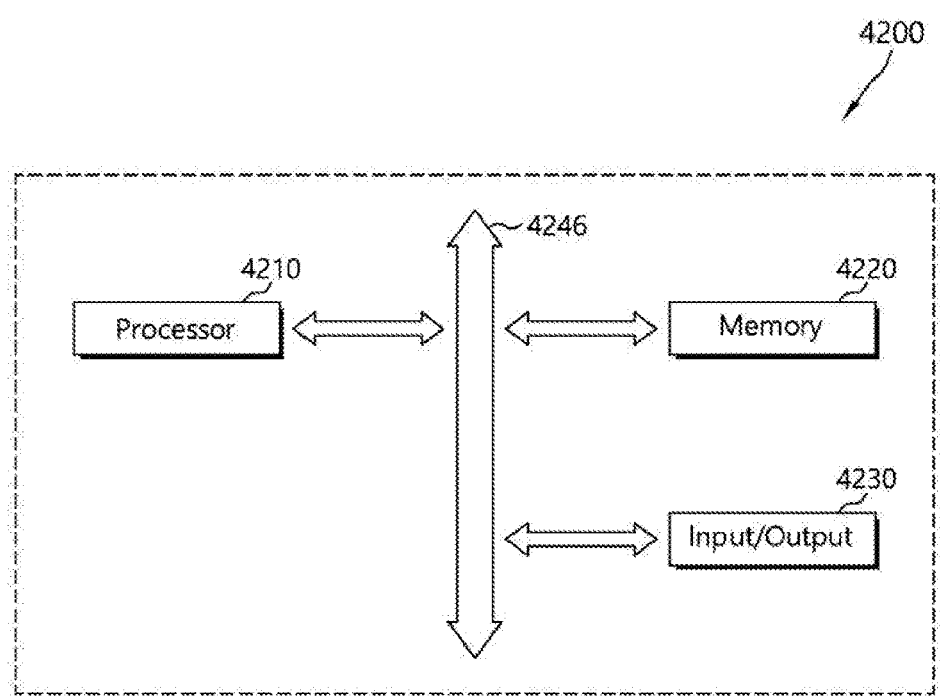
FIG. 6 shows a block diagram of an electronic apparatus including a semiconductor memory apparatus, in accordance with an embodiment of the present disclosure.

FIG. 6 shows a block diagram to assist in the explanation of an electronic apparatus 4200 including a semiconductor memory apparatus in accordance with some embodiments. Referring to FIG. 6, the electronic apparatus 4200 may include a processor 4210, a memory 4220, and an input/output device 4230. The processor 4210, the memory 4220, and the input/output device 4230 may be coupled through a bus 4246.

The memory 4220 may receive a control signal from the processor 4210. The memory 4220 may store a code and data for the operation of the processor 4210. The memory 4220 may be used to store data to be accessed through the bus 4246. The memory 4220 may include at least one of the semiconductor memory apparatuses 100 and 400 shown in FIG. 1 and FIG. 4, respectively. To realize different embodiments, and different modifications to such embodiments, additional circuits and control signals may be provided.

The electronic apparatus 4200 may configure various electronic control apparatuses which use the memory 4220. For example, the electronic apparatus 4200 may be used in a computer system, a wireless communication device, for example, a PDA, a laptop computer, a notebook computer, a web tablet, a wireless phone, a portable phone, a digital music player, an MP3 player, a navigator, a solid state disk (SSD), a household appliance, or additional devices capable of transmitting and receiving information under wireless circumstances.

Descriptions appear below for the detailed realization and modified examples of the electronic apparatus 4200, with reference to FIGS. 7 and 8.

Figure 7:
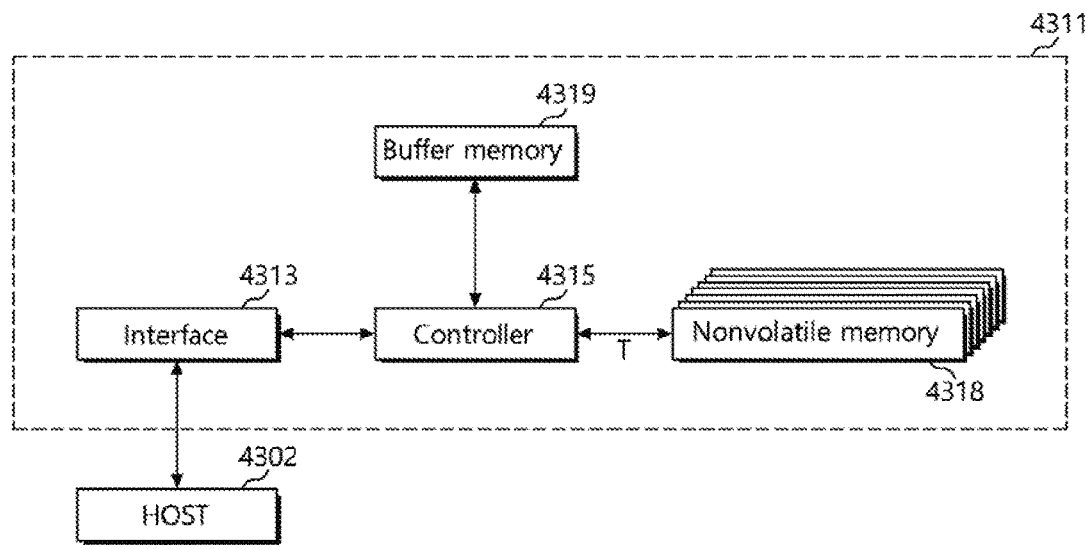
FIG. 7 shows a block diagram illustrating a data storage device including a semiconductor memory apparatus, in accordance with an embodiment of the present disclosure.

FIG. 7 shows a block diagram illustrating a data storage device including a semiconductor memory apparatus in accordance with some embodiments. Referring to FIG. 7, a data storage device, such as a solid state disk (SSD) 4311, may be provided. The solid state disk (SSD) 4311 may include an interface 4313, a controller 4315, nonvolatile memories 4318, and a buffer memory 4319.

The solid state disk 4311 is a device which stores information by using a semiconductor device. The solid state disk 4311 provides advantages in that its speed is high, additionally, a mechanical delay, a failure rate, heat generation, and noise generation decrease, and miniaturization, and light weight may be accomplished, when compared to a hard disk drive (HDD). The solid state disk 4311 may be used in a notebook PC, a net book, a desktop PC, an MP3 player, or a portable storage device.

The controller 4315 may be located adjacent to the interface 4313 and be electrically coupled to the interface 4313. The controller 4315 may be a microprocessor including a memory controller and a buffer controller. The nonvolatile memories 4318 may be located adjacent to the controller 4315 and be electrically coupled to the controller 4315 via connection terminals T. The data storage capacity of the solid state disk 4311 may correspond to the nonvolatile memories 4318. The buffer memory 4319 may be located adjacent to the controller 4315 and be electrically coupled to the controller 4315. Each of the nonvolatile memories 4318 may include at least one semiconductor memory apparatus in accordance with the present teachings, such as the semiconductor memory apparatus 100 of FIG. 1 and/or 400 of FIG. 4.

The interface 4313 may be coupled to a host 4302 and transmit and receive electrical signals, such as data signals. For example, the interface 4313 may be a device which uses the same protocol as SATA, IDE, SCSI, and/or combination thereof. The nonvolatile memories 4318 may be coupled to the interface 4313 via the controller 4315.

The nonvolatile memories 4318 may store the data received through the interface 4313. The nonvolatile memories 4318 may have a characteristic that the data stored therein are retained even though power supply to the solid state disk 4311 is cut off.

The buffer memory 4319 may include volatile memory or nonvolatile memory. The volatile memory may be DRAM and/or SRAM. The nonvolatile memory may include at least one semiconductor memory apparatus in accordance with the present teachings, such as the semiconductor memory apparatus 100 of FIG. 1 and/or 400 of FIG. 4.

The data processing speed of the interface 4313 may be relatively faster as compared to the operation speed of the nonvolatile memories 4318. The buffer memory 4319 may temporarily store data. The data received through the interface 4313 may be temporarily stored in the buffer memory 4319 via the controller 4315, and then, be permanently stored in the nonvolatile memories 4318 in conformity with the data recording speed of the nonvolatile memories 4318.

The data frequently used among the data stored in the nonvolatile memories 4318 may be read in advance and be temporarily stored in the buffer memory 4319. Namely, the buffer memory 4319 may increase the effective operation speed and decrease an error occurrence rate of the solid state disk 4311.

Figure 8:
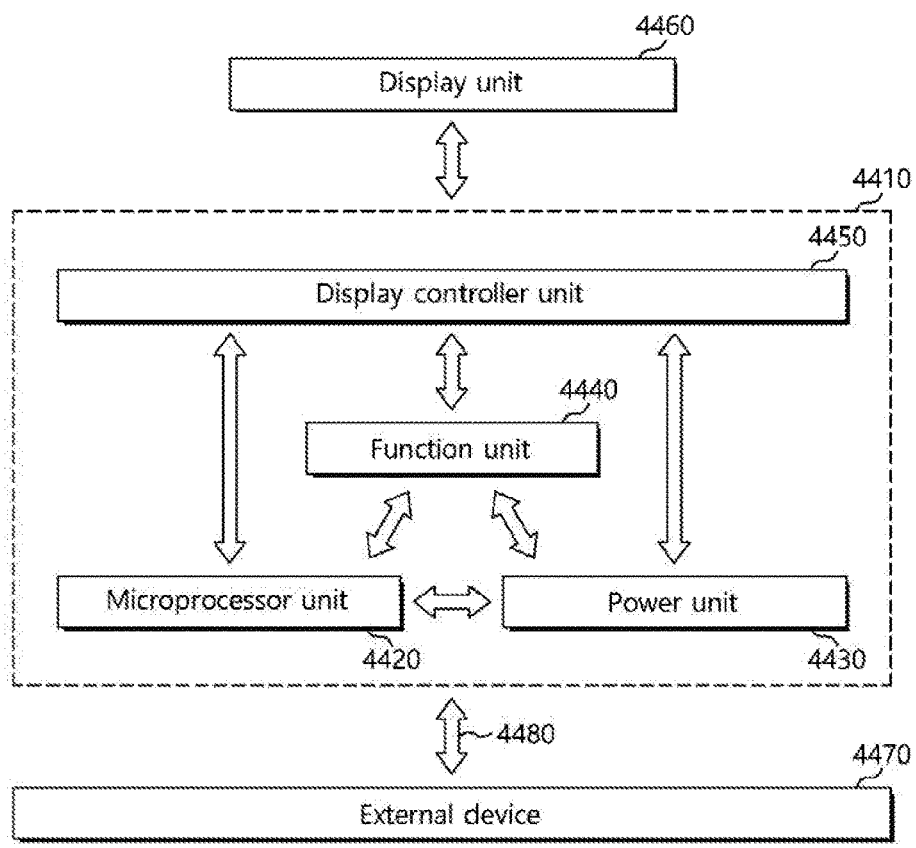
FIG. 8 shows a block diagram illustrating an electronic system including a semiconductor memory apparatus, in accordance with an embodiment of the present disclosure.

FIG. 8 shows a block diagram illustrating an electronic system 4400 including a semiconductor memory apparatus in accordance with some embodiments. Referring to FIG. 8, the electronic system 4400 may include a body 4410, a microprocessor unit 4420, a power unit 4430, a function unit 4440, and a display controller unit 4450.

The body 4410 may be a motherboard which is formed by a printed circuit board (PCB). The microprocessor unit 4420, the power unit 4430, the function unit 4440, and the display controller unit 4450 may be mounted to the body 4410. A display unit 4460 may be disposed inside the body 4410 or outside the body 4410. For example, the display unit 4460 may be disposed on the surface of the body 4410 and display the image processed by the display controller unit 4450.

The power unit 4430 may receive a voltage from an external battery or the like, divide the voltage into desired voltage levels, and supply divided voltages to the microprocessor unit 4420, the function unit 4440, the display controller unit 4450, and so forth. The microprocessor unit 4420 may receive a voltage from the power unit 4430 and control the function unit 4440 and the display unit 4460. The function unit 4440 may perform the various functions of the electronic system 4400. For example, in the case where the electronic system 4400 is a portable phone, the function unit 4440 may include various component elements capable of performing the functions of a portable phone, such as dialing, image outputting to the display unit 4460 through communication with an external device 4470, voice outputting to a speaker, and so forth. In the case where a camera is integrated into the electronic system 4400, the function unit 4440 may also play the role of a camera image processor.

In the case where the electronic system 4400 is coupled with a memory card or the like to extend capacity, the function unit 4440 may be a memory card controller. The function unit 4440 may exchange signals with the external device 4470 through a wired or wireless communication unit 4480. In the case where the electronic system 4400 needs a USB or the like to expand functionality, the function unit 4440 may play the role of an interface controller. The semiconductor memory apparatus 4400 in accordance with the above-described embodiments may be applied as at least any one of the microprocessor unit 4420 and the function unit 4440.

While specific embodiments have been described above, it will be understood by those skilled in the art that the described embodiments represent only a limited number of possible embodiments. Accordingly, the nonvolatile memory apparatus, semiconductor system including the same, and operating method thereof should not be limited based on the described embodiments. Rather, the nonvolatile memory apparatus, semiconductor system including the same, and operating method thereof described herein should only be limited in light of the claims that follow when taken in conjunction with the above description and accompanying drawings.

What is claimed is:

1. A semiconductor memory apparatus comprising:
   a memory cell coupled between a bit line and a word line;
   a sensing line disposed adjacent to the word line to form a capacitor together with the word line; and
   a sense amplifier coupled to the sensing line, wherein the sense amplifier is configured to generate an output signal by detecting a voltage level of the sensing line.

2. The semiconductor memory apparatus of claim 1, further comprising:
   a column switch configured to couple the bit line to a global bit line based on a bit line selection signal; and
   a bit line supply configured to provide a first power voltage to the global bit line.

3. The semiconductor memory apparatus of claim 1, further comprising:
   a row switch configured to couple the word line to a global word line based on a word line selection signal; and a word line supply configured to provide a second power voltage to the global word line.

4. The semiconductor memory apparatus of claim 3, wherein a voltage level of the word line selection signal is changed after the word line is precharged to a voltage level of the second power voltage.

5. The semiconductor memory apparatus of claim 3, wherein the word line supply allows a sneak current to flow through the word line after the word line is precharged to a voltage level of the second power voltage.

6. The semiconductor memory apparatus of claim 1, wherein the sense amplifier generates the output signal by comparing the voltage level of the sensing line with a read reference voltage.

7. The semiconductor memory apparatus of claim 1, further comprising a sensing switch configured to couple the sense amplifier to the sensing line when a sensing enable signal is enabled.

8. The semiconductor memory apparatus of claim 7, wherein the sensing enable signal is enabled a predetermined time after the first power voltage is provided to the bit line.

9. The semiconductor memory apparatus of claim 1, wherein the sensing line extends substantially parallel to the bit line and substantially perpendicular to the word line.

10. A semiconductor memory apparatus comprising:
a plurality of memory cells coupled between a plurality of bit lines and a plurality of word lines, respectively;
a plurality of sensing lines disposed adjacent to the plurality of word lines to form capacitors together with the plurality of word lines, respectively, wherein the plurality of sensing lines extend substantially parallel with the plurality of bit lines and substantially perpendicular to the plurality of word lines; and
a sense amplifier coupled to the plurality of sensing lines and configured to generate an output signal by detecting voltage levels of the plurality of sensing lines.

11. The semiconductor memory apparatus of claim 10, further comprising:
is a plurality of column switches respectively configured to couple the plurality of bit lines to a global bit line based on a plurality of bit line selection signals; and
a bit line supply configured to provide a first power voltage to the global bit line.

12. The semiconductor memory apparatus of claim 10, further comprising:
a plurality of row switches respectively configured to couple the plurality of word lines to a global word line based on a plurality of word line selection signals; and
a word line supply configured to provide a second power voltage to the global word line.

13. The semiconductor memory apparatus of claim 12, wherein a voltage level of a word line selection signal of the plurality of word line selection signals, which is provided to a row switch configured to couple a selected word line of the plurality of word lines to the global word line, is changed after the selected word line is precharged to a voltage level of the second power voltage.

14. The semiconductor memory apparatus of claim 12, wherein the word line supply allows a sneak current to flow through a selected word line of the plurality of selected word lines after the selected word line is precharged to a voltage level of the second power voltage.

15. The semiconductor memory apparatus of claim 10, wherein the sense amplifier generates the output signal by comparing the voltage levels of the plurality of sensing lines with a read reference voltage.

16. The semiconductor memory apparatus of claim 10, wherein the sense amplifier is coupled to the plurality of sensing lines when a sensing enable signal is enabled.

17. The semiconductor memory apparatus of claim 16, wherein the sensing enable signal is enabled a predetermined time after the first power voltage is provided to a selected bit line of the plurality of bit lines.

18. An operating method of a semiconductor memory apparatus, the operating method comprising:
selecting a memory cell by selecting a bit line based on a bit line selection signal and selecting a word line based on a word line selection signal;
precharging the word line to a second power voltage;
changing a voltage level of the word line selection signal and allowing a sneak current to flow through the word line;
providing a first power voltage to the bit line; and
detecting a voltage level of a sensing line disposed adjacent to the word line to form a capacitor together with the word line.

19. The operating method of claim 18, wherein selecting the bit line comprises coupling the bit line to a global bit line based on the bit line selection signal, and wherein selecting the word line comprises coupling the word line to a global word line based on the word line selection signal.

20. The operating method of claim 18, wherein changing of the voltage level of the word line selection signal comprises changing the voltage level of the word line selection signal to partially turn on a row switch configured to receive the word line selection signal.

21. The operating method of claim 18, wherein the sensing line extends substantially parallel with the bit line and substantially perpendicular to the word line.

* * * * *